US009275829B2

(12) United States Patent
Setoguchi et al.

(10) Patent No.: US 9,275,829 B2
(45) Date of Patent: Mar. 1, 2016

(54) IMAGE FORMING DEVICE AND COMPUTER PROGRAM

(75) Inventors: Katsumi Setoguchi, Hitachinaka (JP); Osamu Komuro, Hitachinaka (JP)

(73) Assignee: HITACHI HIGH-TECHNOLOGIES CORPORATION, Tokyo (JP)

(*) Notice: Subject to any disclaimer, the term of this patent is extended or adjusted under 35 U.S.C. 154(b) by 305 days.

(21) Appl. No.: 13/818,094

(22) PCT Filed: Aug. 31, 2011

(86) PCT No.: PCT/JP2011/069760
§ 371 (c)(1),
(2), (4) Date: Feb. 20, 2013

(87) PCT Pub. No.: WO2012/029846
PCT Pub. Date: Mar. 8, 2012

(65) Prior Publication Data
US 2013/0141563 A1    Jun. 6, 2013

(30) Foreign Application Priority Data

Aug. 31, 2010  (JP) ................................. 2010-193075

(51) Int. Cl.
*H01J 3/14* (2006.01)
*G06K 9/36* (2006.01)
(Continued)

(52) U.S. Cl.
CPC .............. *H01J 37/28* (2013.01); *H01J 37/263* (2013.01); *H01J 2237/221* (2013.01); *H01J 2237/24578* (2013.01); *H01J 2237/2826* (2013.01)

(58) Field of Classification Search
CPC ..................................... G06K 9/36; H01J 3/14
See application file for complete search history.

(56) References Cited

U.S. PATENT DOCUMENTS

| 7,187,345 B2 | 3/2007 | Kobaru et al. |
| 7,659,508 B2 | 2/2010 | Nasu et al. |
| 2003/0006371 A1 | 1/2003 | Watanabe et al. |

(Continued)

FOREIGN PATENT DOCUMENTS

| JP | 09-180667 A | 7/1997 |
| JP | 2003-016983 A | 1/2003 |
| JP | 2004-271269 A | 9/2004 |
| JP | 2006-153837 A | 6/2006 |
| JP | 2007-059370 A | 3/2007 |

(Continued)

OTHER PUBLICATIONS

International Search Report issued in International Application No. PCT/J P2011/069760 mailed on Dec. 13, 2011.

(Continued)

*Primary Examiner* — Sath V Perungavoor
*Assistant Examiner* — Patricia I Young
(74) *Attorney, Agent, or Firm* — McDermott Will & Emery LLP

(57) ABSTRACT

In an image forming apparatus and a computer program, extraction of information about distortion in a charged particle beam scan area can be implemented. An image forming apparatus integrates image data obtained by a charged particle beam apparatus and calculates, from a plurality of images with different scan directions of the charged particle beam apparatus, first information about the amount of change in a feature quantity in accordance with the time of irradiation of the charged particle beam, second information about the amount of change in the feature quantity before and after a change in beam scan direction, and/or third information about a position error of a pattern on the image before and after the change in beam scan direction.

10 Claims, 22 Drawing Sheets

(51) Int. Cl.
*H01J 37/28* (2006.01)
*H01J 37/26* (2006.01)

(56) References Cited

U.S. PATENT DOCUMENTS

| | | |
|---|---|---|
| 2006/0091309 A1 | 5/2006 | Oosaki et al. |
| 2009/0032723 A1 | 2/2009 | Fukaya et al. |
| 2009/0179151 A1 | 7/2009 | Cheng et al. |
| 2011/0286685 A1 | 11/2011 | Nishihara et al. |

FOREIGN PATENT DOCUMENTS

| | | |
|---|---|---|
| JP | 2007-192594 A | 8/2007 |
| JP | 2009-037804 A | 2/2009 |
| JP | 2009-170150 A | 7/2009 |
| WO | WO-03/021186 A1 | 3/2003 |
| WO | WO-2010/061516 A1 | 6/2010 |

OTHER PUBLICATIONS

Internationa Search Report issued in International Application No. PCT/JP2011/069760 mailed on Dec. 13, 2011.

FIG. 8

Phenomenon analysis sheet

| No. | Type of feature quantity | Evaluation direction | Contributing factor | | | | |
|---|---|---|---|---|---|---|---|
| | | | Time | Scan direction | | Space | |
| | | | | 180° | 90° | X direction | Y direction |
| 1 | | | | | | | |
| 2 | | | | | | | |
| 3 | | | | | | | |

FIG. 9

Phenomenon library

| Phenomenon | Type of feature quantity | Evaluation direction | Contributing factor | | | | | Countermeasure condition |
|---|---|---|---|---|---|---|---|---|
| | | | Time | Scan direction | | Space | | |
| | | | | 180° | 90° | X direction | Y direction | |
| | | | | | | | | |
| | | | | | | | | |
| | | | | | | | | |

Phenomenon analysis sheet

| No. | Type of feature quantity | Evaluation direction | Contributing factor | | | | |
|---|---|---|---|---|---|---|---|
| | | | Time | Scan direction | | Space | |
| | | | | 180° | 90° | X direction | Y direction |
| 1 | Measured length value (line) | Scan direction | + | | | | |
| 2 | Measured length value (line) | Scan direction | + | | | | |
| 3 | Measured length value (line) | Scan direction | + | | | | |

→ Phenomenon: Contamination

Sample image

Pattern 2
Pattern 1
Pattern 3
Evaluation area

Between frames (pattern 1)

Between frames (pattern 2)

Between frames (pattern 3)

Phenomenon analysis sheet

| No. | Type of feature quantity | Evaluation direction | Contributing factor | | | | |
|---|---|---|---|---|---|---|---|
| | | | Time | Scan direction | | Space | |
| | | | | 180° | 90° | X direction | Y direction |
| 1 | Measured length value (line) | Scan direction | — | | | | |
| 2 | Measured length value (line) | Scan direction | — | | | | |
| 3 | Measured length value (line) | Scan direction | — | | | | |

→ Phenomenon: Shrinkage

FIG. 18

Phenomenon analysis sheet

| No. | Type of feature quantity | Evaluation direction | Contributing factor | | | | |
|---|---|---|---|---|---|---|---|
| | | | Time | Scan direction | | Space | |
| | | | | 180° | 90° | X direction | Y direction |
| 1 | Measured length value (pitch) | Scan direction | + | | | | |
| 2 | Measured length value (pitch) | Scan direction | + | | | | |
| 3 | Measured length value (pitch) | Scan direction | + | | | | |

→ Phenomenon: Charging (case A)

FIG. 20

Phenomenon analysis sheet

| No. | Type of feature quantity | Evaluation direction | Contributing factor | | | | |
|---|---|---|---|---|---|---|---|
| | | | Time | Scan direction | | Space | |
| | | | | 180° | 90° | X direction | Y direction |
| 1 | Measured length value (line) | Scan direction | | | | | |
| 2 | Measured length value (line) | Scan direction | | + | | + | |
| 3 | Measured length value (line) | Scan direction | | − | | + | |

Inconsistency

Phenomenon: Charging (case B)

Distortion amount of pattern 1 = {(L1$_{2nd}$) + (L1$_{3rd}$) − (L1$_{1st}$) − (L1$_{4th}$)} ÷ 2
Accompanying information: Amount of change in scan direction = 180°, Position error vector (X1$_{180}$, Y1$_{180}$)

Distortion amount of pattern 2 = {(L2$_{2nd}$) + (L2$_{3rd}$) − (L2$_{1st}$) − (L2$_{4th}$)} ÷ 2
Accompanying information: Amount of change in scan direction = 180°, Position error vector (X2$_{180}$, Y2$_{180}$)

FIG. 22

Phenomenon analysis sheet

| No. | Type of feature quantity | Evaluation direction | Contributing factor | | | | |
|---|---|---|---|---|---|---|---|
| | | | Time | Scan direction | | Space | |
| | | | | 180° | 90° | X direction | Y direction |
| 1 | Measured length value (asymmetric) | Scan direction | | + | | + | |
| 2 | Measured length value (asymmetric) | Scan direction | | + | | − | |

Phenomenon: Charging (case C)

Inconsistency

FIG. 24

Phenomenon analysis sheet

| No. | Type of feature quantity | Evaluation direction | Contributing factor | | | | |
|---|---|---|---|---|---|---|---|
| | | | Time | Scan direction | | Space | |
| | | | | 180° | 90° | X direction | Y direction |
| 1 | Measured length value (hole) | Scan direction | | | + | | + |
| 2 | Measured length value (hole) | Scan direction | | | + | | − |

Inconsistency

Phenomenon: Charging (case D)

IMAGE FORMING DEVICE AND COMPUTER PROGRAM

RELATED APPLICATIONS

This application is the U.S. National Phase under 35 U.S.C. §371 of International Application No. PCT/JP2011/069760, filed on Aug. 31, 2011, which in turn claims the benefit of Japanese Application No. 2010-193075, filed on Aug. 31, 2010, the disclosures of which Applications are incorporated by reference herein.

TECHNICAL FIELD

The present invention relates to an image forming apparatus and a computer program. Particularly, the present invention relates to an image forming apparatus and a computer program such that an image obtained by a charged particle beam scan can be evaluated.

BACKGROUND ART

A charged particle beam apparatus represented by a scanning electron microscope scans a sample with a thinly converged charged particle beam, and forms a sample image on the basis of a signal emitted from the sample. Such charged particle beam apparatuses have an increasingly higher resolution, and increasingly higher ratios of magnification for observation are required.

As a result of the increase in the observation magnification ratios, the issue of sample image reliability has arisen, as described below. When the sample is scanned with the charged particle beam, depending on the material of the sample, the sample may be shrunk or a carbon-based deposit may become attached to the surface of the sample (contamination) due to dissociation of hydrocarbon-based residual gas in the apparatus and the sample caused by the energy of the beam, such that the observed image of the sample may become different from its shape prior to observation.

Further, when the sample is scanned with the charged particle beam, a charging bias may be produced in the observed area, resulting in a sample image different from the actual shape of the sample. It is known that the charging bias is dependent on the following various contributing factors.

a) Changes depending on the energy and current density of the primary electron beam, observation magnification ratio, and the secondary electron/backscattered electron yield of the sample.

b) Temporal changes depending on electron movement or diffusion, annihilation by electron hole recombination and the like.

c) Changes depending on scan method.

As a result of the above phenomena, observation of the sample causes sample image distortion and a significant decrease in sample image reliability. Various methods for decreasing the sample image distortion have been considered.

Patent Literature 1 describes a technique for suppressing the sample shrinkage or contamination due to electron beam irradiation. In this technique, the scan interval of the electron beam is increased and the length of the scan area in the Y-direction is increased compared with the length in the X-direction such that the scan area is rectangular, and the amount of electron beam irradiation per unit area of the sample is decreased.

Patent Literature 2 describes a technique for suppressing sample image distortion due to the influence of localized charging of the sample by electron beam irradiation. The technique involves setting the order of raster scan in the vertical direction of the screen such that the center of arbitrary two lines that have been previously scanned is scanned at all times.

Patent Literature 3 describes a technique for suppressing sample image distortion due to changes in charging potential in sample areas with different charge characteristics when the sample is scanned with electron beam. The technique involves measuring the charging in each area of the sample and grasping electric characteristics so that setting conditions for charging or neutralizing means can be optimized.

CITATION LIST

Patent Literature

Patent Literature 1: WO2003/021186 (corresponding to U.S. Pat. No. 7,659,508)
Patent Literature 2: Japanese Patent Publication (Kokai) No. 2007-059370 A (corresponding to U.S. Pat. No. 7,187,345)
Patent Literature 3: Japanese Patent Publication (Kokai) No. 2009-170150 A (corresponding to US Patent Publication No. 2009/0179151)

SUMMARY OF INVENTION

Technical Problem

The techniques according to Patent Literatures 1, 2, and 3 may be effective against certain specific phenomena on the sample. However, shrinkage, contamination, and charging phenomena may occur simultaneously, depending on the sample and observation conditions. Further, a phenomenon that differs from conventional charging may occur.

An analysis conducted by the inventors has shown that a phenomenon may occur in which a part of an image formed by charged particle beam irradiation is varied with respect to another part due to an unknown contributing factor or a combination of contributing factors. Because the sample may be formed in a distorted manner, it has been difficult to determine whether the sample is formed with distortion or the image is distorted simply by visual observation of the image. It is also very difficult to determine image distortion by visual inspection.

In the following, an image forming apparatus and a computer program with an object of extracting information about distortion in an area scanned by charged particle beam will be described.

Solution to Problem

An embodiment for achieving the object proposes: an image forming apparatus that integrates image data obtained by a charged particle beam apparatus and that calculates, from a plurality of images with different scan directions of the charged particle beam apparatus, first information about the amount of change in a feature quantity in accordance with the time of irradiation of the charged particle beam, second information about the amount of change in the feature quantity before and after a change in beam scan direction, and/or third information about a position error of a pattern on the images before and after the change in beam scan direction; and a computer program for causing a computing apparatus to perform the above process.

Advantageous Effects of Invention

By calculating the degree of each of a plurality of image distortion contributing factors, identification of a distortion causing contributing factor or detection of an apparatus condition such that the generation of distortion can be suppressed can be easily implemented.

BRIEF DESCRIPTION OF DRAWINGS

FIG. 8 illustrates a phenomenon analysis sheet created on the basis of the calculated amount of change in feature quantity and accompanying information.

FIG. 9 illustrates a phenomenon library used for identifying a phenomenon, which associates each phenomenon with the time between images, scan direction, and the tendency of change in feature quantity due to spatial change.

FIG. 18 illustrates an example of the phenomenon analysis sheet in the case where the observed area is positively charged.

FIG. 20 illustrates an example of the phenomenon analysis sheet in the case where there is a change in feature quantity due to space (X-direction).

FIG. 22 illustrates an example of the phenomenon analysis sheet in the case where there is a change in feature quantity due to scan direction (180°).

FIG. 24 illustrates an example of the phenomenon analysis sheet in the case where there is a change in feature quantity due to scan direction (90°).

DESCRIPTION OF EMBODIMENTS

In the following, an apparatus that acquires a sample image under three or more conditions mainly with different scan directions (directions of a scan line) of charged particle beam, detects sample image distortion on the basis of a change in a feature quantity of the sample image due to changes in time, scan direction, and space, and identifies a phenomenon change contributing factor from a library associating the change in feature quantity with phenomena; a computer program for causing a computing apparatus to perform such a process; and a storage medium in which the program is stored will be described.

The process performed by the computing apparatus enables detection of information about sample image distortion caused by charged particle beam. Acquisition of the distortion information makes it possible to make judgments about the reliability of adjustment, measurement, and inspection of apparatus conditions. When a complex phenomenon develops, contributing factors of the phenomenon can be grasped by using the library, so that improved work efficiency can be achieved.

While the following description is directed to a scanning electron microscope (SEM) as a mode of charged particle beam apparatus, the present invention is not limited to such configuration. For example, a focused ion beam apparatus that irradiates a sample with an ion beam emitted from an ion source, such as a liquid-metal ion source or gaseous ion source, may be used as the image forming apparatus.

Figure 1:
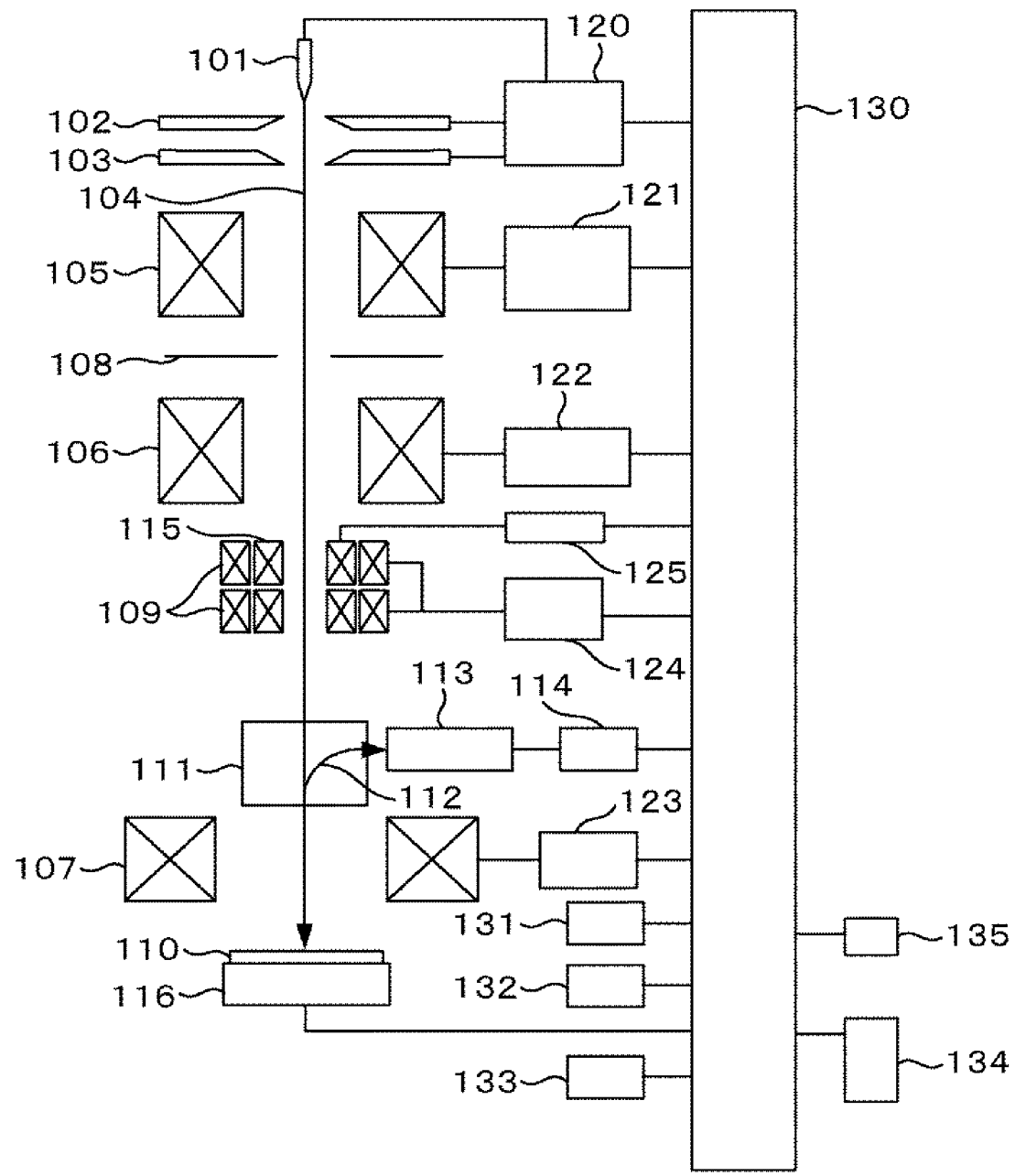
FIG. 1 schematically illustrates a configuration of a scanning electron microscope.

FIG. 1 schematically illustrates a configuration of the scanning electron microscope. A voltage is applied between a cathode 101 and a first anode 102 by a high-voltage control power supply 120 controlled by a computer 130 such that a primary electron beam 104 is emitted from the cathode 101 with a predetermined emission current. An acceleration voltage is applied between the cathode 101 and a second anode 103 by the high-voltage control power supply 120 controlled by the computer 130, whereby the primary electron beam 104 emitted from the cathode 101 is accelerated as it travels to a lens system in a subsequent stage.

The primary electron beam 104 is converged by a first focusing lens 105 controlled by a lens control power supply 121. After an unwanted area of the primary electron beam is eliminated by an aperture plate 108, the primary electron beam is converged onto a sample 110 as a fine spot by a second focusing lens 106 controlled by a lens control power supply 122 and an objective lens 107 controlled by an objective lens control power supply 123. The objective lens 107 may be of various modes, such as an in-lens system, an out-lens system, or a snorkel system (semi-in-lens system). A retarding system is also possible in which a negative voltage is applied to the sample so as to decelerate the primary electron beam. Further, the respective lenses may include an electrostatic lens composed of a plurality of electrodes.

The primary electron beam 104 is two-dimensionally (X and Y directions) scanned by a scanning coil 109 over the sample 110. The scanning coil 109 is supplied with current from a scanning coil control power supply 124. A secondary signal 112 of secondary electrons and the like emitted by the sample 110 in response to the primary electron beam irradiation is detected by a secondary signal detector 113 after the secondary electrons and the like are separated from primary electrons over the objective lens 107 by an orthogonal electromagnetic field generating apparatus 111 for secondary signal separation. The signal detected by the secondary signal detector 113 is amplified by a signal amplifier 114 and then transferred to an image memory 131 and displayed on an image display apparatus 132 as a sample image. The secondary signal detector may be configured to detect secondary electrons and reflected electrons, light, or X-ray.

An address signal corresponding to a memory position in the image memory 131 is generated in the computer 130 and, after analog conversion, supplied to the scanning coil 109 via the scanning coil control power supply 124. The address signal for the X-direction is a digital signal repeating 0 to 512 when the image memory 131 has 512×512 pixels, for example. The address signal for the Y-direction is a digital signal repeating 0 to 512 to which one is added when the address signal for the X-direction reaches from 0 to 512. These signals are converted into analog signals.

Because the address in the image memory 131 and the address of a deflecting signal for scanning the primary electron beam correspond to each other, a two-dimensional image of an area in which the primary electron beam is deflected by the scanning coil 109 is recorded in the image memory 131. The signals in the image memory 131 can be read successively in chronological order by a read address generation circuit (not shown) synchronized with a read clock. The signal read in accordance with the address is analog-converted so as to provide a luminance modulation signal for the image display apparatus 132.

Figure 2:
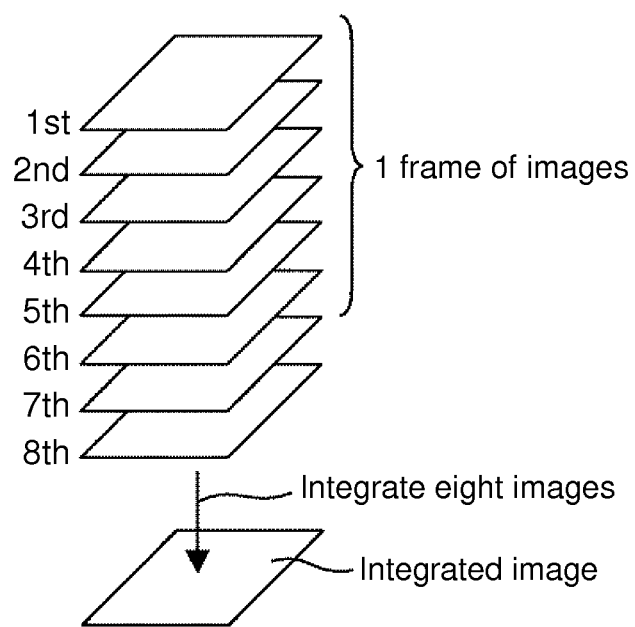
FIG. 2 illustrates an example of frame integration in which a single complete image is formed by storing images obtained by eight two-dimensional scans in a layered manner.

The image memory 131 is provided with the function of storing images (image data) for improving S/N ratio in a layered (composed) manner. As illustrated in FIG. 2, a single complete image is formed by storing images obtained by eight two-dimensional scans in a layered manner. Specifically, a final image is formed by composing images formed by one or more X-Y scans. The number of images for forming the single complete image (frame integration number) may be set as desired. For example, an appropriate value is set in view of various conditions, such as secondary electron generation efficiency. The image to be finally acquired may also be formed by layering a plurality of images each of which has been formed by integrating a plurality of images. The input of information into the image memory 131 may be interrupted when a desired number of images has been stored, or by performing blanking of the primary electron beam 104 thereafter.

A sequence may also be provided such that, when the frame integration number is set to eight, the first image is erased upon input of the ninth image so that eventually eight images remain. Alternatively, weighted averaging may be calculated such that the integrated image stored in the image memory 131 is multiplied by ⅞ upon input of the ninth image, and then the ninth image is added to the product. A two-stage deflecting coil 115 (image shift deflector) is disposed at the same position as the scanning coil 109 such that the position (observation field of view) of the primary electron beam 104 on the sample 110 can be two-dimensionally controlled. The deflecting coil 115 is controlled by a deflecting coil control power supply 125.

The sample stage 116 is configured to move the sample 110 in at least two directions (X-direction and Y-direction) in a plane perpendicular to the primary electron beam. The SEM illustrated in FIG. 1 is provided with the function of forming a line profile on the basis of the detected secondary electrons or reflected electrons, for example. The line profile is formed on the basis of the amount of electron detected when the primary electron beam is scanned one- or two-dimensionally, or the luminance information and the like of the sample image. The obtained line profile is used for measuring the size of a pattern formed on a semiconductor wafer, for example. The apparatus according to the present embodiment may also be provided with an interface 134 for transferring image data to an external apparatus and the like, or a recording apparatus 133 for storing image data in a predetermined storage medium.

An input apparatus 135 may be used for designating optical conditions (electron beam converging condition and electron beam scan current); scan conditions (magnification ratio, scan method, and scan speed); image loading conditions (the number of pixels and the number of images integrated); pattern size measurement conditions; and image output and storage.

Further, the apparatus according to the present embodiment may be provided with the function of storing conditions for observing a plurality of points on a semiconductor wafer (optical conditions, scan conditions, and image loading conditions) as a recipe in advance, so that pattern size measurement or observation can be performed in accordance with the contents of the recipe.

While the description of FIG. 1 is based on the assumption that the control apparatus is integrated with the scanning electron microscope either literally or equivalently, the present invention is not limited to such configuration. For example, a process may be performed by a control processor separately provided from the scanning electron microscope mirror body, as will be described below. In this case, a transmission medium for transmitting the detection signal detected by the secondary signal detector 113 to the control processor and transmitting a signal from the control processor to the lenses, deflector and the like of the scanning electron microscope, and input/output terminals for the input and output of the signal transmitted via the transmission medium may be required.

A program for performing the process described below may be registered in a storage medium so that the program can be executed by the control processor including an image memory and configured to supply a signal required by the scanning electron microscope.

Figure 25:
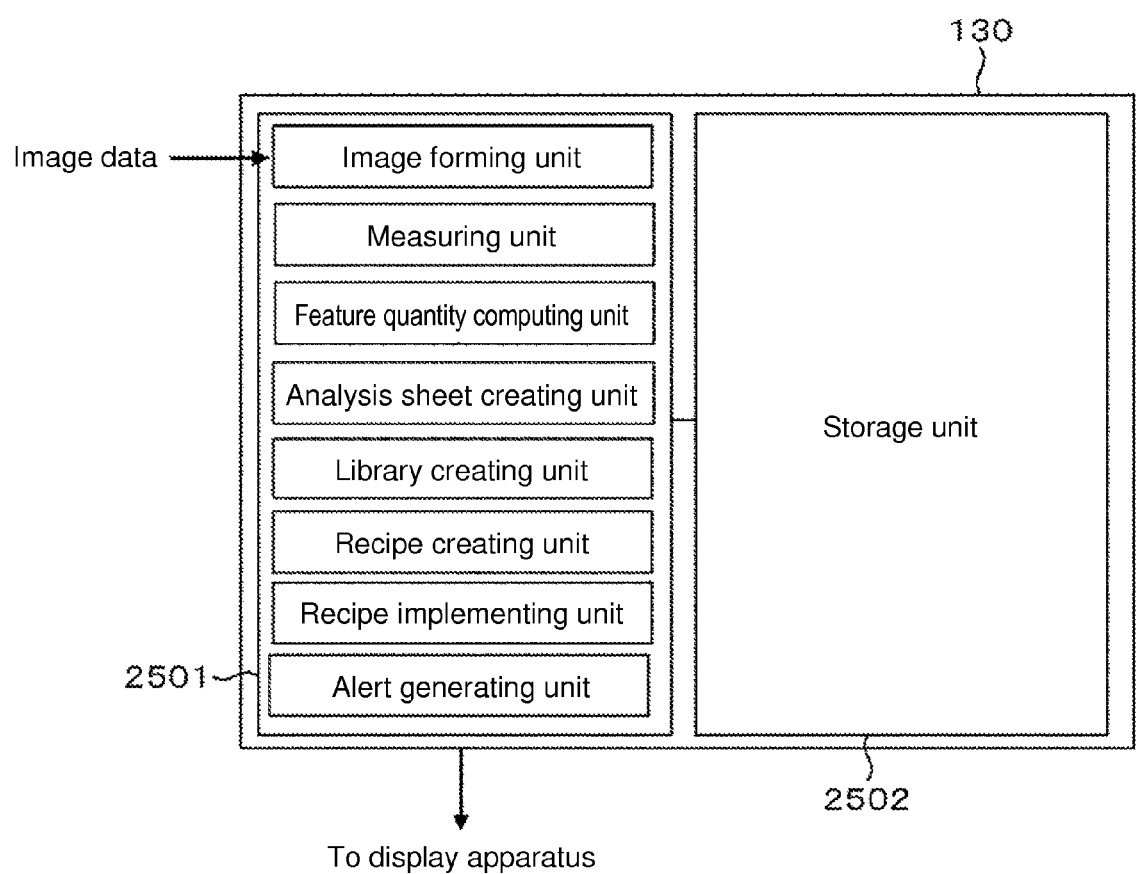
FIG. 25 schematically illustrates a computing apparatus provided in a computer that controls the scanning electron microscope.

FIG. 25 schematically illustrates the computer 130. The computer 130 includes a computing apparatus 2501 and a storage unit 2502. The computing apparatus 2501 executes a process in accordance with conditions stored in the storage unit 2502, as will be described below. The image data or an image obtained or formed by the scanning electron microscope, or a measurement result and the like may be stored in the storage unit 2502 or in an external storage medium, which is not shown, via a communication line and the like.

An image forming unit forms an image by integrating the image data obtained by the scanning electron microscope. In the storage unit, necessary information, such as the number of frames or the scan direction and the like during image formation, are also stored. A measuring unit performs pattern measurement on the basis of the formed image, luminance distribution information and the like. Pattern measurement is performed by forming waveform data referred to as a "line profile" and utilizing information about the distance between peaks of the waveform data, for example. In a feature quantity computing unit, a computation concerning the data obtained by the scanning electron microscope is performed in accordance with computation formulas as will be described below. Further, in an analysis sheet creating unit, a process is performed in which an analysis sheet which will be described below is created on the basis of computation information obtained by the feature quantity computing unit and image formation information registered in a recipe creating unit which will be described below. Further, in a library creating unit, a library for collating information with the analysis sheet is created on the basis of analysis sheet information created by the analysis sheet creating unit and externally input information. The recipe creating unit sets apparatus conditions of the electron microscope (such as magnification ratio (field of view size), scan direction, acceleration voltage, probe current, and beam scan position) as an operation program on the basis of the input information, and stores the program in the storage medium. A recipe implementing unit causes the scanning electron microscope to be operated in accordance with the recipe registered in the storage medium. Further, an image diagnosing process is performed in accordance with process steps illustrated in FIG. 3. An alert generating unit issues an alert when the measurement result obtained by the measuring unit or the result of computation by the feature quantity computing unit exceeds a predetermined threshold value, or when predetermined information is obtained by collation of the feature quantity and the library.

Figure 3:
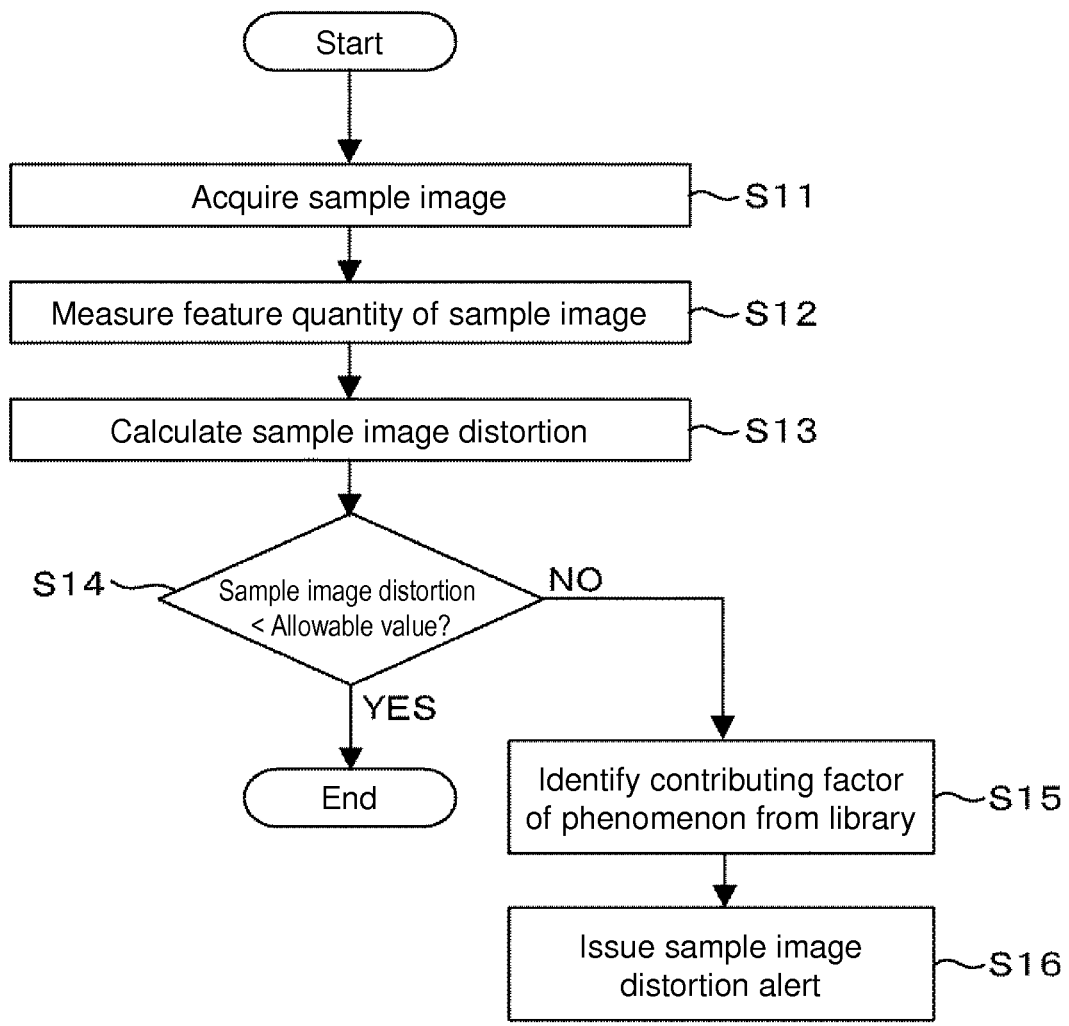
FIG. 3 is a flowchart of a process of detecting distortion of a sample image obtained by electron beam scan.

FIG. 3 is a flowchart illustrating the steps for determining sample image distortion.

First, in step S11 for acquiring a sample image, a sample image is acquired under three of more conditions with different electron beam scan directions. For example, the scan directions include an opposite direction and a vertical direction with reference to the observation conditions. In the case of two-dimensional scan, when the scan direction is reversed, the image is rotated by 180°, and when the scan direction is changed to the vertical direction, the image is rotated by 90°. The sample image is acquired in the same area. However, the sample image may be acquired at different locations in the case of repetitive patterns that can be considered the same pattern.

The acquired sample image may be stored not just as the final integrated image but also as an un-integrated image or a partially integrated image. Each image is associated with the observation conditions as accompanying information.

Figure 4:
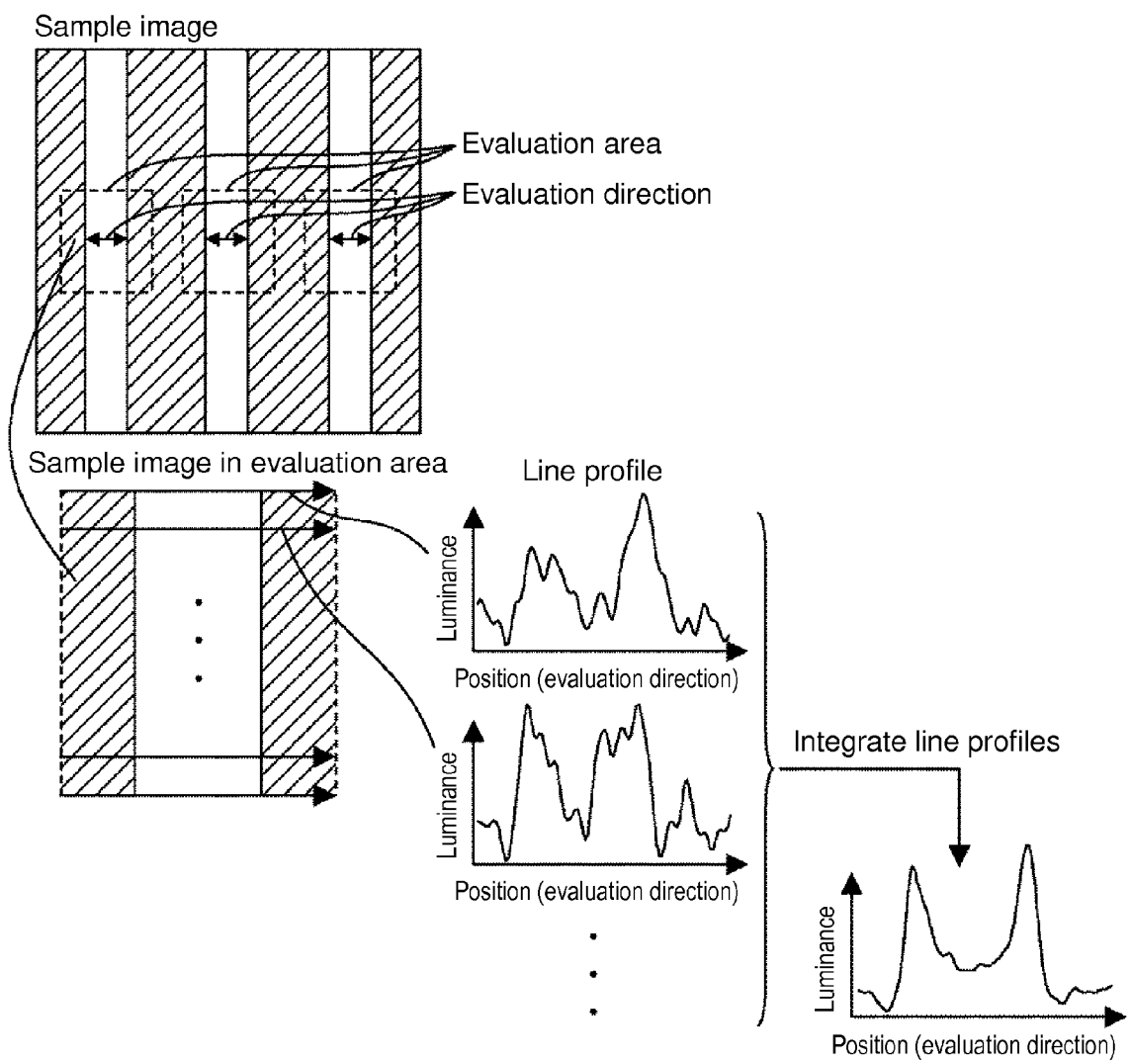
FIG. 4 illustrates an example of a method for measuring a feature quantity in which a line profile is formed on the basis of a sample image.

In step S12 for measuring a feature quantity of the sample image, a feature quantity is calculated from the entire sample image or from image information for a partial evaluation area. As shown in FIG. 4, the feature quantity can be measured from the line profile of the stored image. The line profile is acquired in the evaluation area in an evaluation direction, where the feature quantity may include pattern size or the pitch size between patterns. The measurement of the feature quantity may be conducted not just for the stored image but also for an image composed of a part of the stored image.

Figure 5:
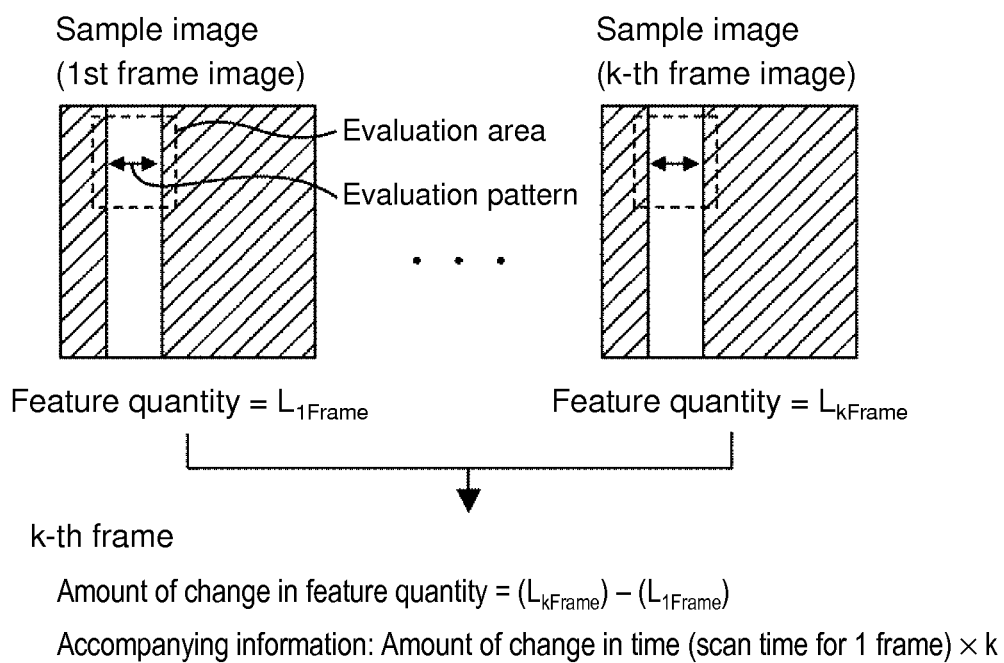
FIG. 5 illustrates an example of a method for calculating the amount of change in the feature quantity due to time, in which an image between frames is used.

In step S13 for calculating sample image distortion, sample image distortion is calculated from a change in feature quantity due to time between images, and the amount of change in feature quantity due to scan direction and space. The feature quantity is associated with a relevant change factor as accompanying information. The change in feature quantity due to time is calculated from the amount of change in feature quantity between images. An accumulated total scan time is also associated as accompanying information. For example, when the feature quantity is calculated from between frame images, when the feature quantity of the k-th (k is a positive integer) frame image is $L_{kFrame}$, as shown in FIG. 5, the amount of change in feature quantity of the k-th frame image is calculated according to expression (1):

$$\text{Amount of change in feature quantity} = (L_{kFrame}) - (L_{1Frame}) \quad (1)$$

Accompanying information: amount of change in time= (scan time for one frame)×k

Figure 6:
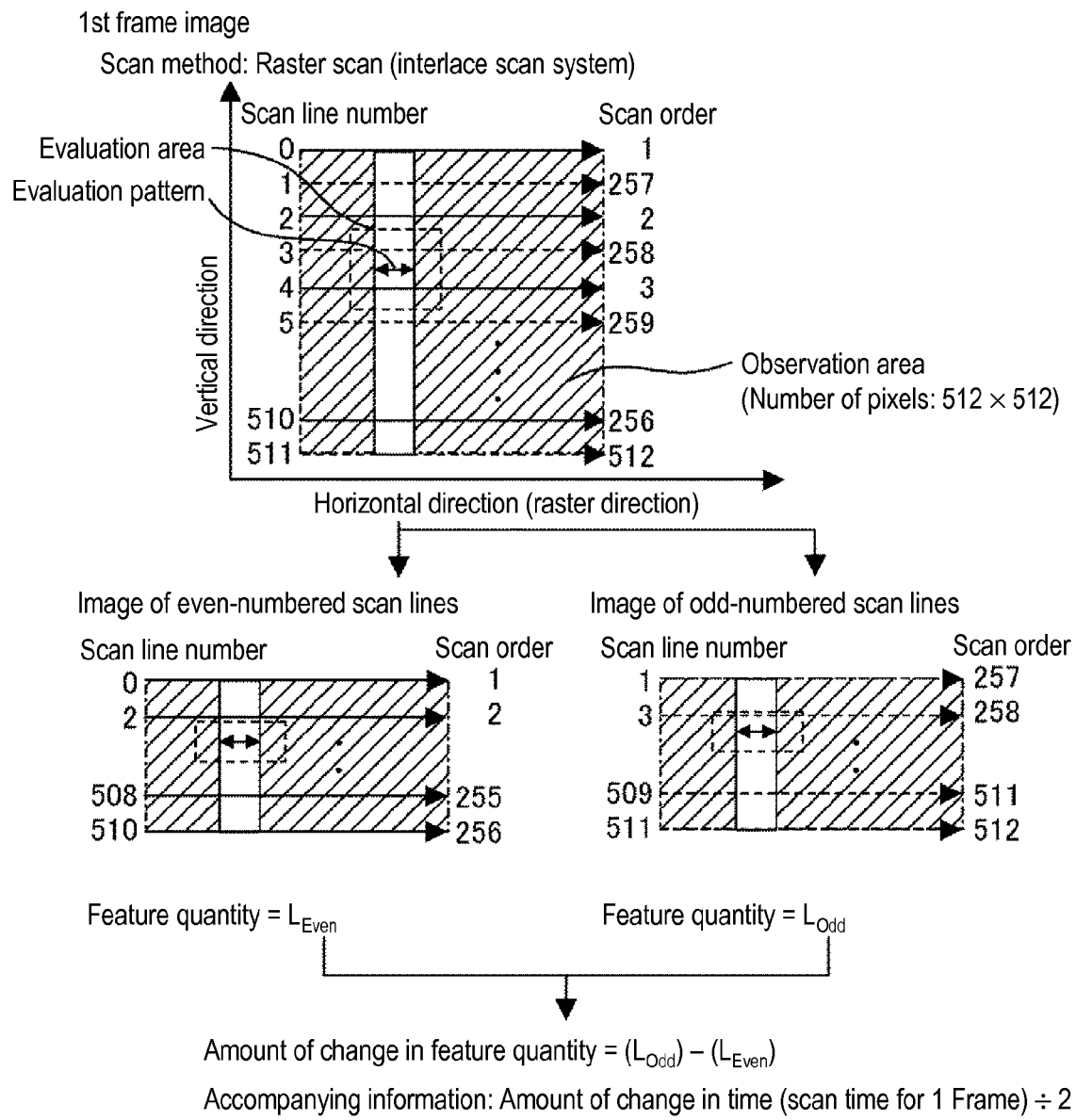
FIG. 6 illustrates an example of a method for calculating the amount of change in the feature quantity due to time, in which an image of even-numbered lines and an image of odd-numbered lines are used when raster scanning of interlace type is performed.

Further, in the case of raster scanning of interlace type, the amount of change in feature quantity in one frame can be calculated by dividing the first frame image into an image of even-numbered lines and an image of odd-numbered lines, as shown in FIG. 6. When the feature quantity of the image of the even-numbered lines is "$L_{Even}$", and the feature quantity of the image of the odd-numbered lines is "$L_{Odd}$", the change in feature quantity between the even-numbered line scan and the odd-numbered line scan is calculated according to expression (2). Further, the scan time for a half-frame is calculated as accompanying information.

$$\text{Amount of change in feature quantity} = (L_{Odd}) - (L_{Even}) \quad (2)$$

Accompanying information: amount of change in time= (scan time for one frame)÷2

The change in feature quantity due to scan direction and space is calculated from the amount of change in feature quantity between images acquired under three or more conditions with different scan directions.

Expressions (1) and (2) are computation formulas for calculating the amount of change in feature quantity that is changed as the number of frames is increased. The number of frames is changed in accordance with (in proportion to) the beam irradiation time. Thus, expressions (1) and (2) are information about the amount of change in feature quantity that is changed in accordance with the beam irradiation time.

Figure 7:
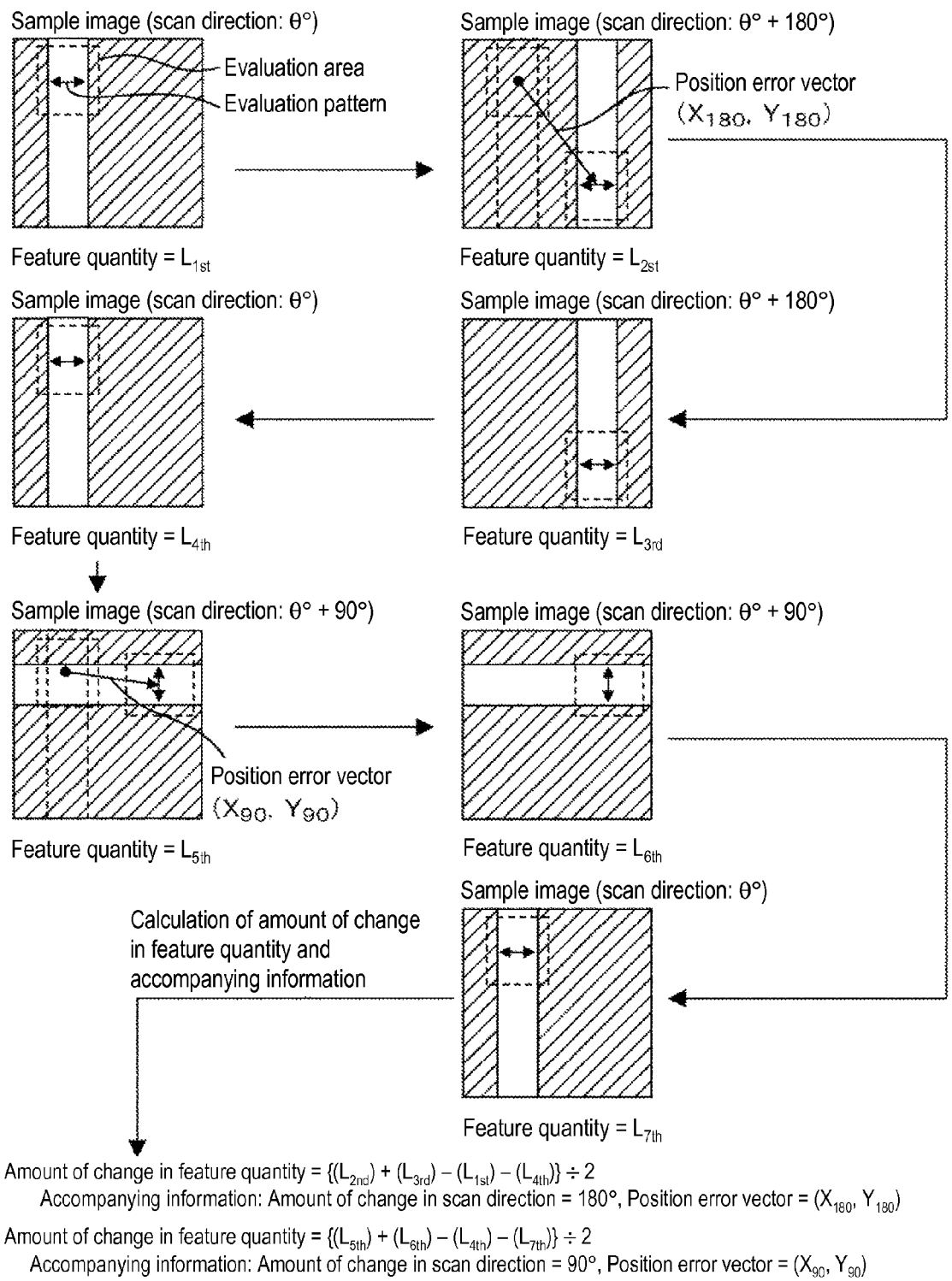
FIG. 7 illustrates an image acquiring procedure for acquiring a plurality of sample images in the same observed area when measuring the change in feature quantity due to scan direction and space, and a method for calculating the amount of change in feature quantity.

The amount of change in scan direction and a pattern position error vector are associated as accompanying information. For example, when a plurality of sample images is acquired in the same observed area, as shown in FIG. 7, the images are acquired in the following order: 1) initial observation condition (scan direction: θ°; image for determining the feature quantity $L_{1st}$); 2) opposite scan direction condition (scan direction: θ+α° (θ+180° in the present example); image for determining the feature quantity $L_{2nd}$); 3) opposite scan direction condition (scan direction: θ+α°; image for determining the feature quantity $L_{3rd}$, with a greater predetermined number of frames or a greater amount of beam irradiation per predetermined time than those of the image of 2)); 4) initial observation condition (scan direction: θ°; image for determining the feature quantity $L_{4th}$); 5) vertical scan direction condition (scan direction: θ+β° (θ+90° in the present example); image for determining the feature quantity $L_{5th}$); 6) vertical scan direction condition (scan direction: θ+β°: image for determining the feature quantity $L_{6th}$, with a greater number of predetermined frames or a greater amount of beam irradiation per predetermined time than those of the image of 5); and 7) initial observation condition (scan direction: θ°; image for determining the feature quantity $L_{7th}$). On the basis of the respective feature quantities $L_{1st}$, $L_{2nd}$, $L_{3rd}$, $L_{4th}$, $L_{5th}$, $L_{6th}$, and $L_{7th}$, the amount of change in feature quantity due to scan direction and space and the accompanying information are calculated according to expressions (3) and (4):

$$\text{Amount of change in feature quantity} = (L_{2nd} + L_{3rd} - L_{1st} - L_{4th}) \div 2 \quad (3)$$

Accompanying information: amount of change in scan direction=180°, position error vector=(X 180°, Y 180°)

$$\text{Amount of change in feature quantity} = (L_{5th} + L_{6th} - L_{4th} - L_{7th}) \div 2 \quad (4)$$

Accompanying information: amount of change in scan direction=90°, position error vector=(X 90°, Y 90°)

When the images are acquired in such an order, when the feature quantity of the pattern before electron beam scan is L; the amount of change in feature quantity of the actual pattern due to the k-th electron beam scan, namely, the amount of change in feature quantity of the pattern excluding the sample image distortion due to charging, is Ek; and the amount of change in feature quantity of the pattern due to charging at that time is a D scan direction, $L_{1st}$ to $L_{4th}$ are as follows, for example:

$$L_{1st} = L + E_{k1st} + D_{0°} \quad (5)$$

$$L_{2nd} = L + E_{k1st} + E_{k2nd} + D_{180°} \quad (6)$$

$$L_{3rd} = L + E_{k1st} + E_{k2nd} + E_{k3rd} + D_{180°} \quad (7)$$

$$L_{4th} = L + E_{k1st} + E_{k2nd} + E_{k3rd} + E_{k4th} + D_{0°} \quad (8)$$

L: True value of pattern size
such that expressions (3) and (4) are rewritten as expressions (9) and (10), respectively:

$$\text{Amount of change in feature quantity} = (D_{180°} - D_{0°} + (E_{2nd} - E_{4th})) \div 2 \quad (9)$$

Accompanying information: amount of change in scan direction=180°, position
error vector=(X 180°, Y 180°)

$$\text{Amount of change in feature quantity} = (D_{90°} - D_{0°} + (E_{5th} - E_{7th})) \div 2 \quad (10)$$

Accompanying information: amount of change in scan direction=180°, position
error vector=(X 180°, Y 180°)

Thus, when ($E_{2nd} - E_{4th}$) and ($E_{5th} - E_{7th}$) are considered to be sufficiently small relative to an allowable value for the change in feature quantity, the present image acquiring procedure is valid.

On the other hand, for detecting the sample image distortion, a normalized correlation value between images in an evaluation area may be used. In this case, too, the sample image distortion is calculated from the change in feature quantity due to time between images, and the amount of change in feature quantity due to scan direction and space, as described above.

Expressions (3) and (4) are computation formulas for calculating the values relating to the amount of change in feature quantity before and after a change in beam scan direction. Specifically, the values are index values indicating a change in feature quantity in accordance with the scan line direction or the position of the object pattern in the field of view.

In step S14 for determining the sample image distortion, it is determined whether the amount of change in feature quantity calculated above satisfies a preset allowable value. When the sample image distortion does not satisfy the allowable value, a phenomenon analysis sheet illustrated in FIG. 8 is created in step S15 for identifying phenomenon contributing factors from the library, on the basis of the amount of change in feature quantity calculated above and the accompanying information. The phenomenon analysis sheet may be created only with respect to the items for which the change in feature quantity has deviated from the allowable value. In FIG. 8, in the column "No.", a number is allocated for each evaluation area. In "type of feature quantity", measured length value (line), measured length value (space), measured length value (asymmetric pattern), measured length value (between patterns) and the like are noted as objects for evaluation. In the column "time", the sign of the feature quantity calculated by expressions (1) and (2) is noted. In the column "scan direction", the sign of the feature quantity calculated by expression (3) is noted for "180°" and the sign of the feature quantity calculated by expression (4) is noted for "90°". In the column "space", the sign of the product of the feature quantity according to expression (3) and the X-component of the position error vector, or the sign of the product of the feature quantity according to expression (4) and the X-component of the position error vector, is noted for "X-direction", while the product of the feature quantity according to expression (3) and the Y-component of the position error vector, or the product of the feature quantity according to expression (4) and the Y-component of the position error vector, is noted for "Y-direction". In the time column, the scan direction column, and the space column, consistency is confirmed in the group with the same type of feature quantity, and the data of the column with inconsistency is invalidated. The phenomenon analysis sheet thus created makes it possible to efficiently grasp the change contributing factors of the feature quantity.

As described above, the variation contributing factor of the feature quantity is stored in the storage medium in association with the image data acquisition conditions, such as the type of feature quantity and the evaluation direction, and such information are displayed by the image display apparatus 132 and the like. In this way, the operator of the electron microscope can easily identify the variation contributing factor of the feature quantity.

Next, from a phenomenon library illustrated in FIG. 9 which associates each phenomenon with the tendency of change in feature quantity due to changes in the time between images, scan direction, and space, a contributing factor corresponding to the contributing factor in the phenomenon analysis sheet is found and the phenomenon is identified. The "type of feature quantity" and "contributing factor" are the same as those of the phenomenon analysis sheet. In the "phenomenon" column, an appropriate name for the phenomenon is given. In the "countermeasure condition" column, one or a plurality of countermeasure methods effective for the phenomenon may be set.

Thus, by comparing the measurement result (phenomenon analysis sheet) and the library (phenomenon library) on a variation contributing factor combination basis, the distortion contributing factor can be identified.

In step S16 for issuing a sample image distortion alert, an alert that there is distortion in the sample image is displayed on a screen. Further, the amount of change in feature quantity calculated above and the accompanying information may be displayed on the screen. Further, the phenomenon analysis sheet and the countermeasure methods described in the phenomenon library may be displayed on the screen. The result of the phenomenon analysis sheet may be registered in the library.

Figure 10:
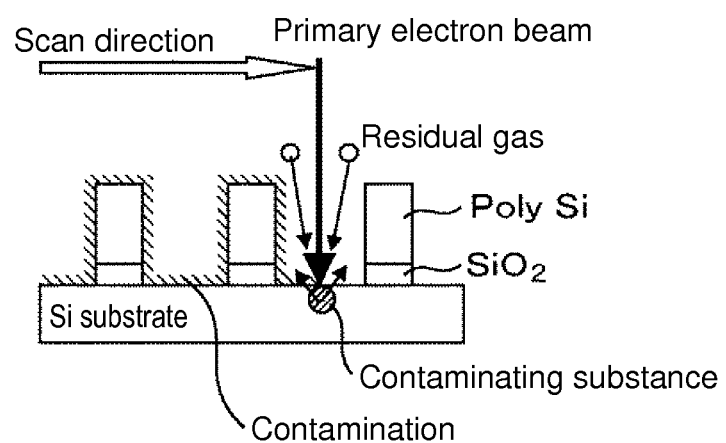
FIG. 10 illustrates a physical phenomenon on the sample surface in which, when the sample is scanned with charged particle beam, a hydrocarbon-based residual gas in the apparatus and the sample is dissociated, resulting in the attachment of a carbon-based deposit on the sample surface (contamination).
Figure 11:
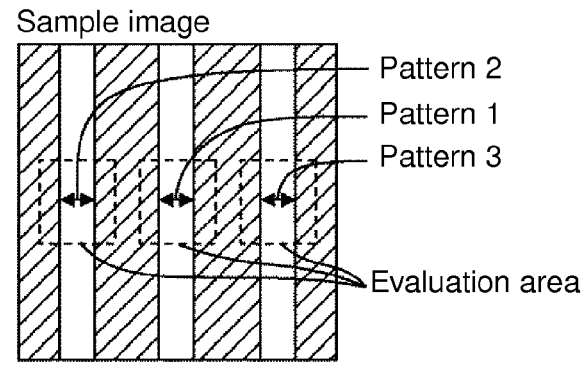
FIG. 11 illustrates an example of the change in feature quantity when contamination has occurred alone.
Figure 11:
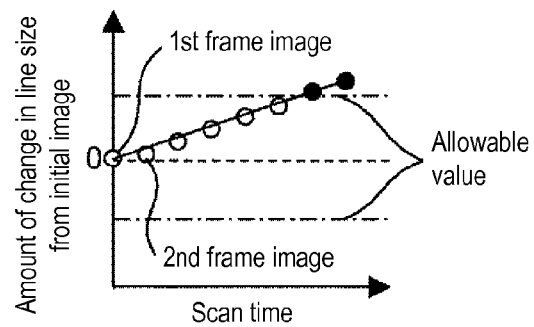
Figure 11:
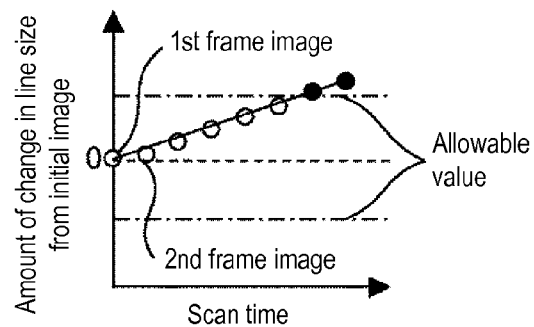
Figure 11:
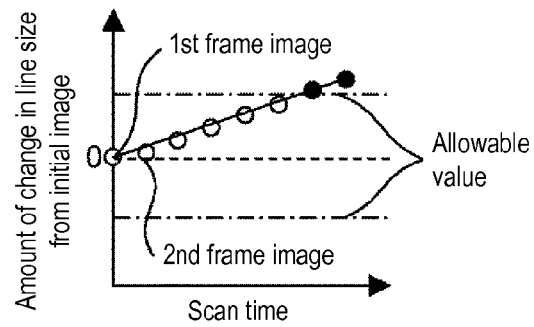

In the following, an example of the result obtained in the present embodiment will be described with reference to a specific phenomenon. As shown in FIG. 10, when a sample is scanned with a charged particle beam, a hydrocarbon-based residual gas in the apparatus and the sample may be dissociated such that a carbon-based deposit may become attached to the sample surface (contamination). As a countermeasure for this, it is effective to decrease the irradiation density of the electron beam as an observation condition, and for this purpose the frame integration number may be decreased or the technique described in Patent Literature 1 may be used. FIG.

Figures 12, 13:
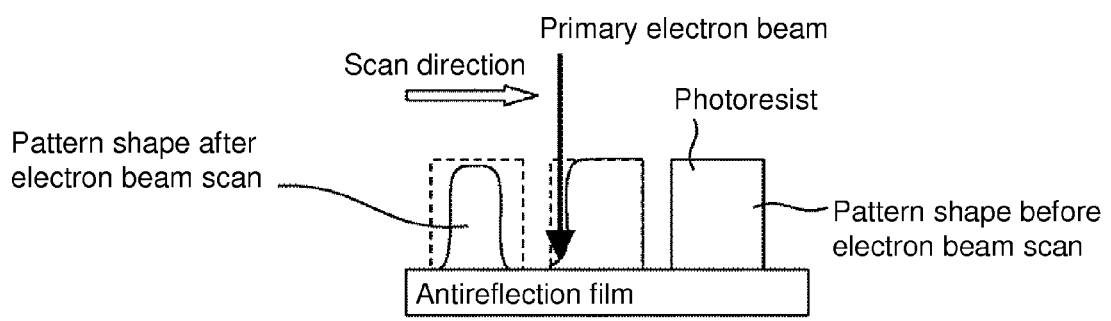
FIG. 12 illustrates an example of the phenomenon analysis sheet in the case of contamination that has occurred alone.
FIG. 13 illustrates a physical phenomenon on the sample surface in the case of shrinkage of the sample, such as an ArF resist or an organic low-k material, due to the energy of the charged particle beam with which the sample is scanned.

11 illustrates the result in the case where contamination has occurred alone. A change in feature quantity due to time is observed and the line size is increased with scan time. FIG. 12 illustrates the resultant phenomenon analysis sheet. The type of feature quantity is the measured length value of line, the evaluation direction is the scan direction, and the time is plus because the change in feature quantity is increasing.

Further, when there is a difference in contamination (size increase) in each pattern, distortion may be caused in the image for one reason or another. For example, a bias may be caused in the amount of beam irradiation per unit area due to the influence of charging. Namely, while the size width should vary with the same transition if the pattern of the same material is irradiated with the same beam, a difference in size variation may be caused over time when there is a bias in the irradiation condition within the field of view (FOV) for some reason. According to the present embodiment, such state can be grasped by monitoring the transition in feature quantity of the patterns disposed at different positions in the FOV over time. The operator of the electron microscope, by referring to the monitored result, can make a decision as to whether the optical conditions of the electron microscope are appropriate.

For example, when only one or two of the size values of three patterns exceed a predetermined value, an alert may be issued if the discrepancy between the rate of change of the size value of one pattern and the rate of change of the size value of another pattern is not less than a predetermined value, thus letting the operator know that the existing apparatus conditions are not appropriate.

Figure 14:
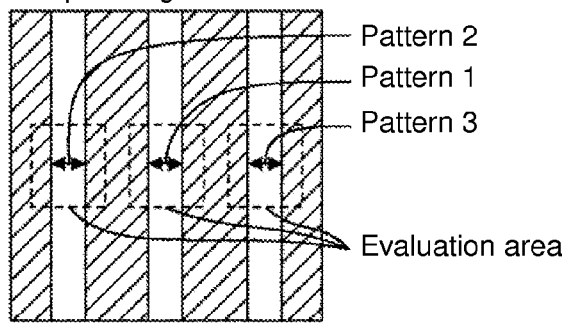
FIG. 14 illustrates an example of the change in feature quantity in the case where shrinkage has occurred alone.
Figure 14:
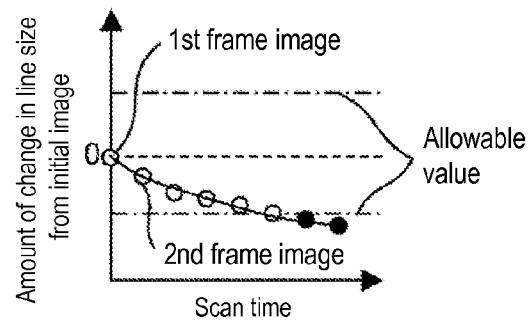
Figure 14:
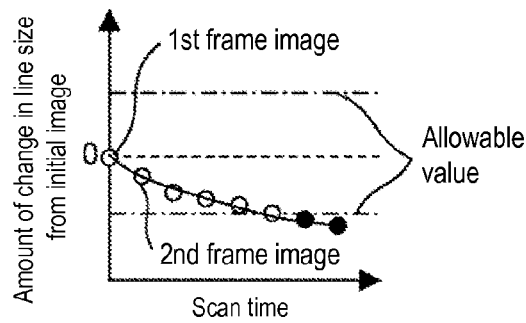
Figure 14:
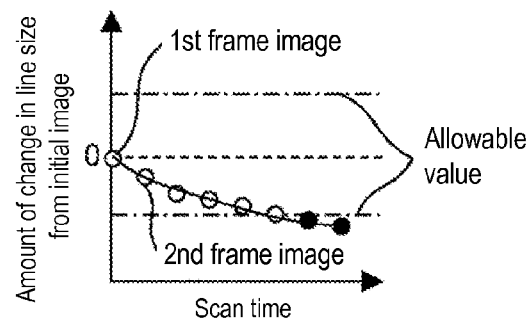
Figures 15, 16:
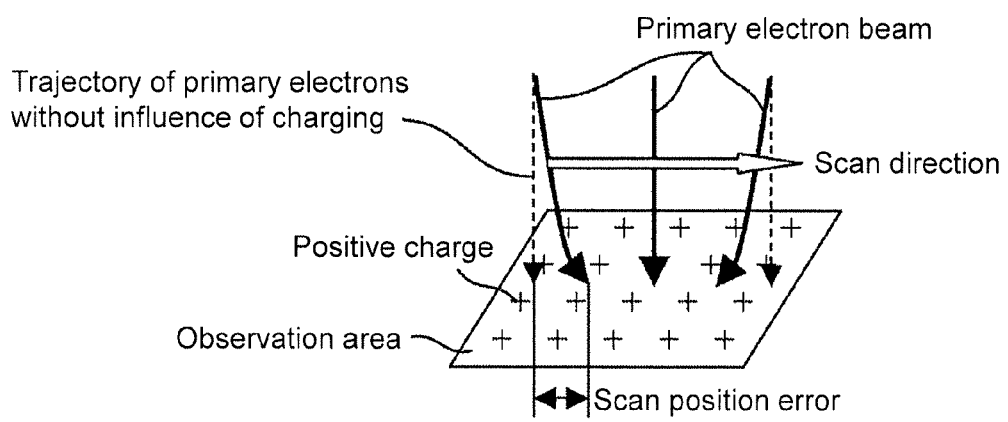
FIG. 15 illustrates an example of the phenomenon analysis sheet in the case where shrinkage has occurred alone.
FIG. 16 illustrates a physical phenomenon on the sample surface in the case where the observed area is positively charged by the scan of an even-numbered line when the sample is scanned with charged particle beam by raster scanning of interlace type.

As shown in FIG. 13, when a sample is scanned with a charged particle beam, the sample may be shrunk by the energy of the beam when the sample is an ArF resist or an organic low-k material, for example. As a countermeasure for this, it is effective to decrease the irradiation density of the electron beam as an observation condition, and for this purpose the frame integration number may be decreased or the technique described in Patent Literature 1 may be used. FIG. 14 illustrates the result in the case where shrinkage occurred alone. A change in feature quantity due to time is observed, and the line size is decreased with scan time. FIG. 15 illustrates the resultant phenomenon analysis sheet. The type of feature quantity is the measured length value of line, the evaluation direction is the scan direction, and the time is negative because the change in feature quantity over time is decreasing.

Figure 17:
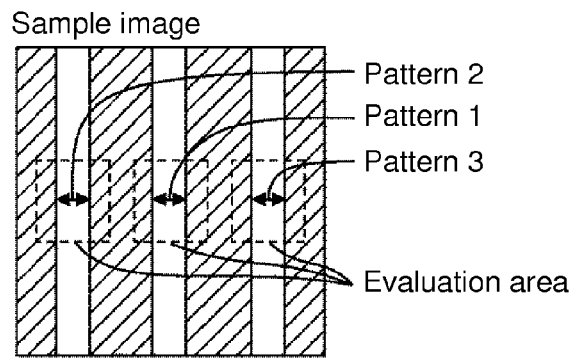
FIG. 17 illustrates an example of the change in feature quantity when the observed area is positively charged.
Figure 17:
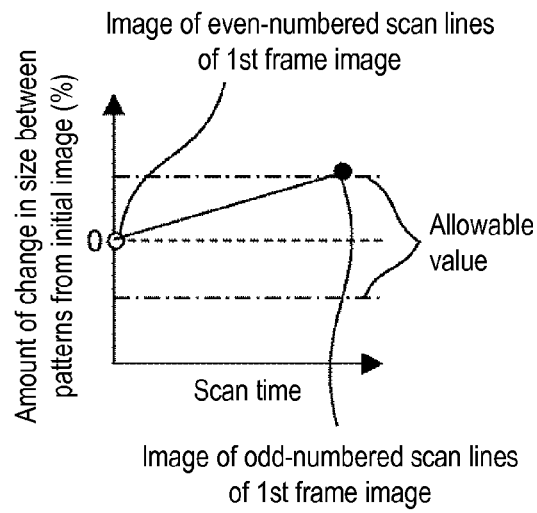
Figure 17:
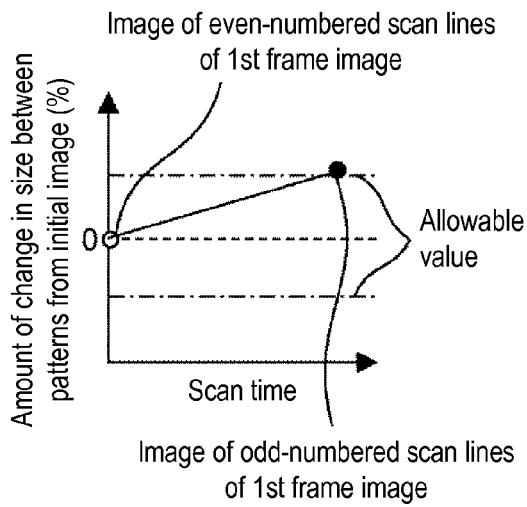
Figure 17:
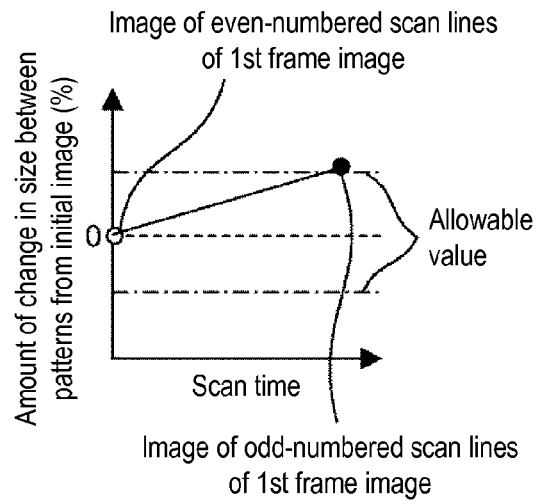

As shown in FIG. 16, when a sample is scanned with a charged particle beam for raster scanning of interlace type, the observed area is positively charged by scanning of an even-numbered line. Thereafter, when an odd-numbered line is scanned, a potential gradient due to the positive charge is produced such that the trajectory of the primary electrons is bent and the scan area is decreased. As a result, the actual observation magnification ratio becomes greater than the set magnification ratio. As a countermeasure for this, it is effective to reduce or neutralize the charging, and for this purpose the techniques described in Patent Literatures 2 and 3 may be used. FIG. 17 illustrates the result in the case where the observed area was uniformly and stably positively charged. A change in feature quantity due to time is observed, and the pitch size is increased between the even-numbered line and the odd-numbered line scans in the first frame. Thereafter, the charge state of the observed area is stabilized such that no change in feature quantity due to time is observed between frames. FIG. 18 illustrates the resultant phenomenon analysis sheet. The type of feature quantity is the measured length value of pitch, the evaluation direction is the scan direction, and the time is positive because the change in feature quantity is increasing.

When areas with different charge characteristics are scanned with electron beam, the charge potential is varied between the respective areas and the sample image distortion also becomes complex depending on the pattern. However, even when such complex phenomenon is produced, the method proposed by the present embodiment makes it possible to detect the sample image distortion and easily grasp by what contributing factor the change is caused.

Figure 19:
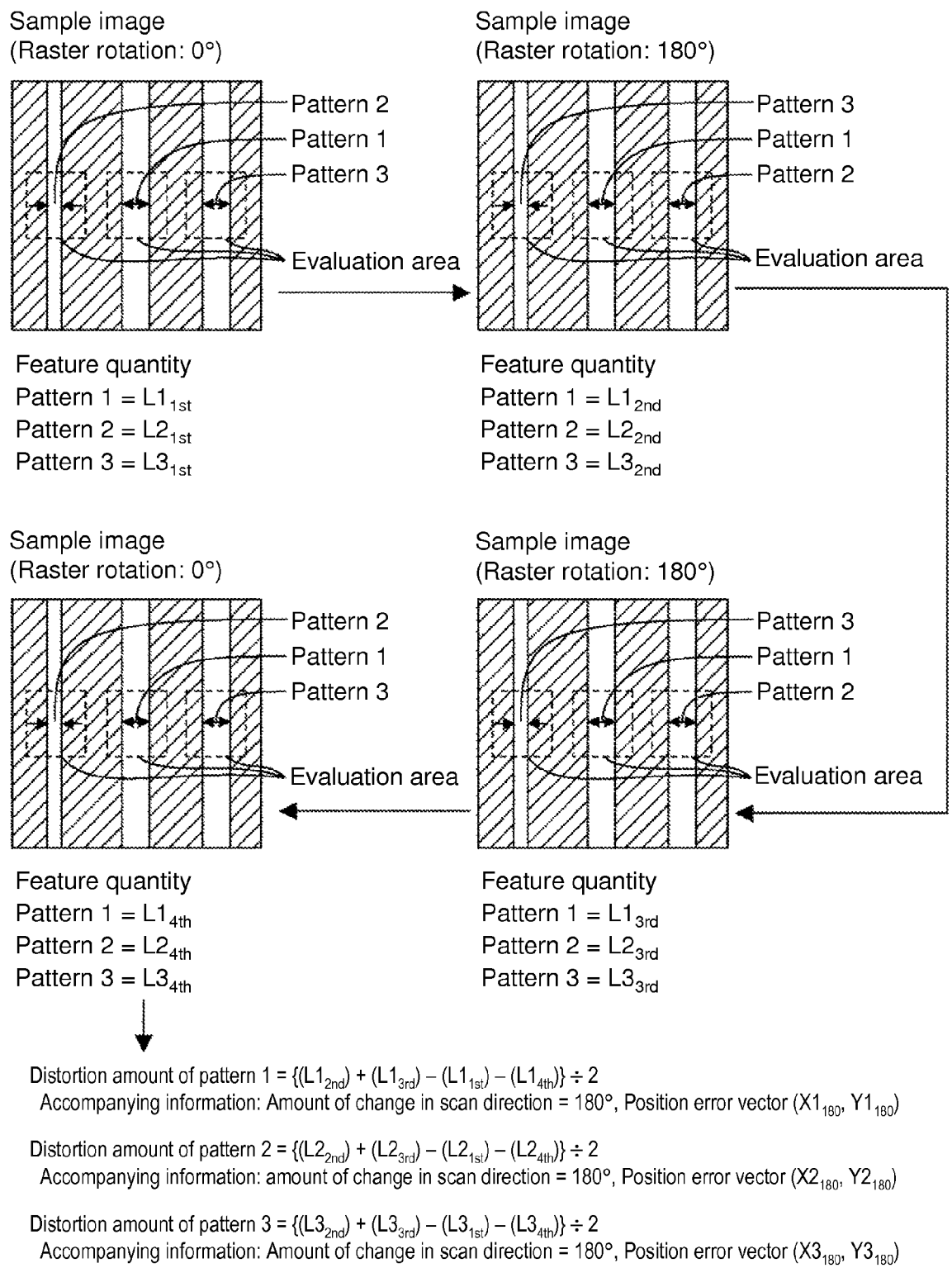
FIG. 19 illustrates an example of the change in feature quantity in the case where the pattern size is changed when the scan direction is reversed.

FIG. 19 illustrates an example in which there are three vertical line patterns with respect to the scan direction, where the pattern size may be changed when the scan direction is reversed. The change in feature quantity differs depending on the line pattern. FIG. 20 illustrates the resultant phenomenon analysis sheet. The type of feature quantity is the measured length value of line, and the evaluation direction is the scan direction. With respect to the scan direction (180°), inconsistency is found because the sign of the change in feature quantity differs depending on the pattern. With respect to the space (X-direction), pattern 1 is zero because it is positioned at the center of the screen; pattern 2 is positive because the position error in the X-direction is positive and the line size is also increasing; and pattern 3 is positive because the position error in the X-direction is negative and the line size is also decreasing. Thus, it is seen that the present sample image has distortion due to space.

Figure 21:
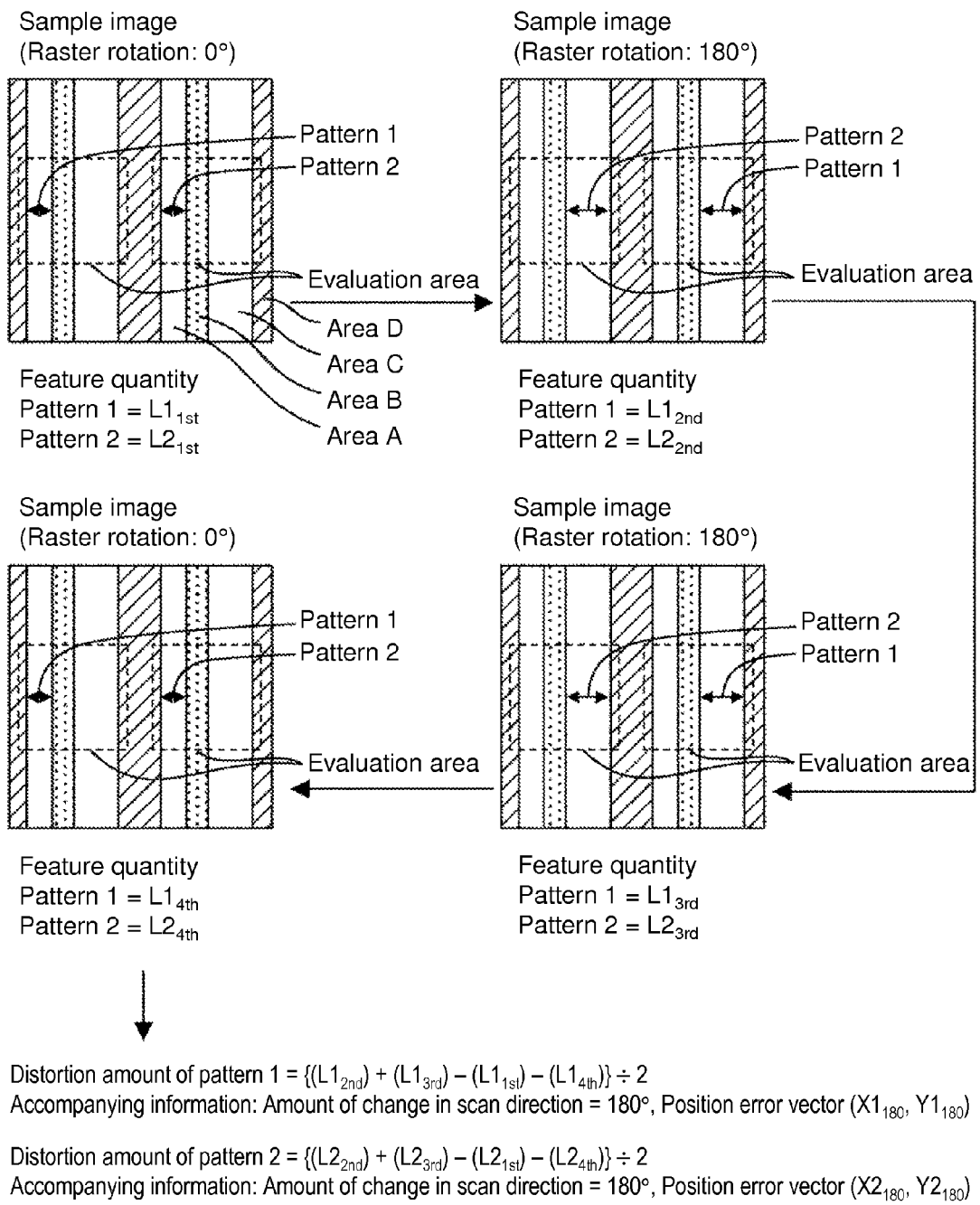
FIG. 21 illustrates an example of the change in feature quantity in the case where the pattern size is changed when the scan direction is reversed.

FIG. 21 illustrates an example in which the pattern has a plurality of areas and the pattern size is changed when the scan direction is reversed. FIG. 22 illustrates the resultant phenomenon analysis sheet. The type of feature quantity is asymmetric between the left and right edges because the left-side edge of the evaluation pattern is from area D to area A while the right-side edge is from area A to area B, and the evaluation direction is the scan direction. With respect to the scan direction (180°), patterns 1 and 2 are positive because the change in feature quantity is both positive. With respect to the spatial direction (X-direction), pattern 1 is positive because the position error in the X-direction is positive and the pattern size is also increasing; and pattern 2 is negative because the position error in the X-direction is negative and the pattern size is increasing. Thus, inconsistency is found because the space direction differs depending on the pattern. Accordingly, it is seen that the present sample image has distortion due to scan direction (180°).

Figure 23:
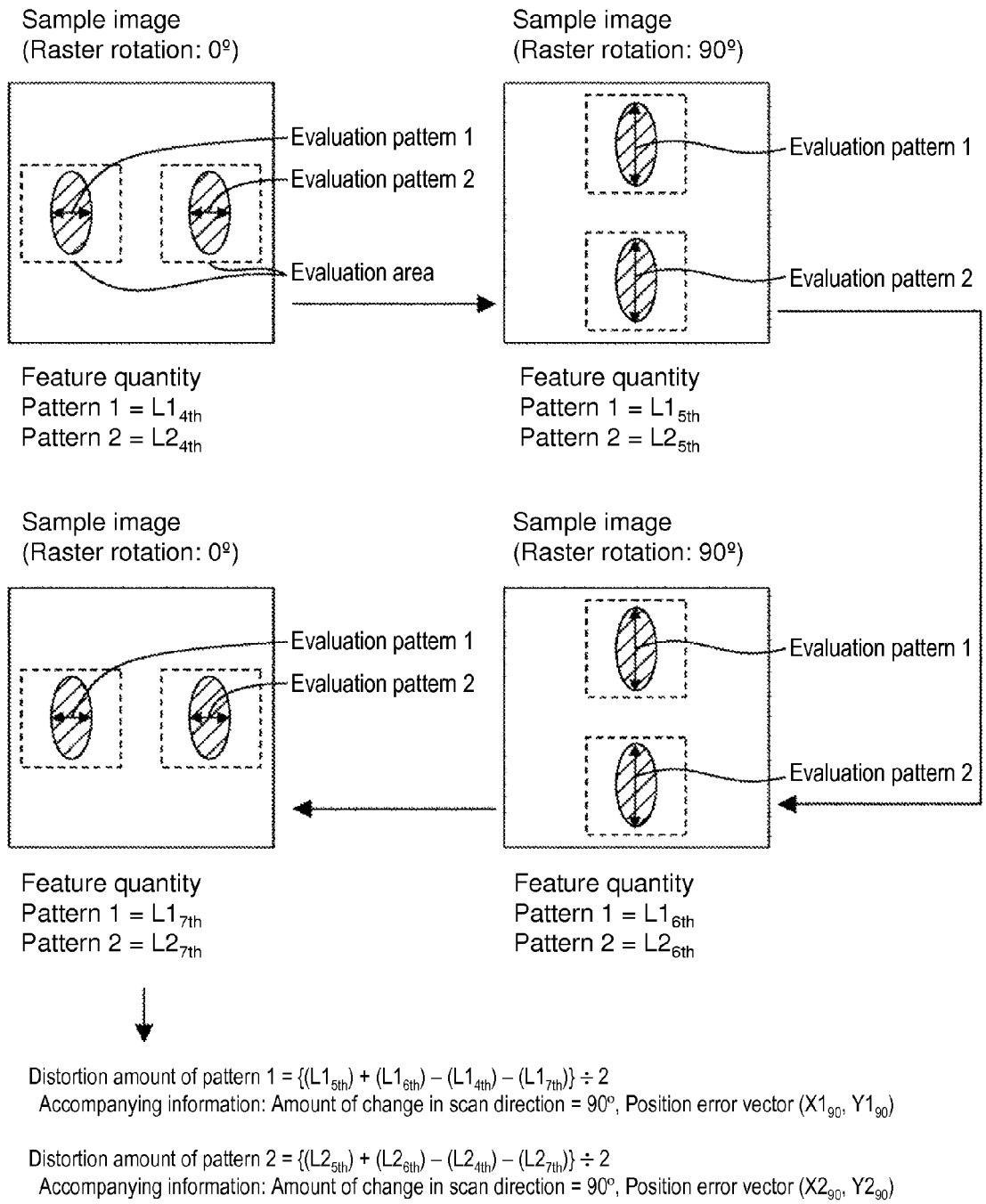
FIG. 23 illustrates an example of the change in feature quantity in the case where the pattern size is changed when the scan direction is made vertical.

As shown in FIG. 23, when there is a hole pattern, the hole shape may be distorted when the scan direction is changed to the vertical direction. FIG. 24 illustrates the resultant phenomenon analysis sheet. The type of feature quantity is the measured length value of the hole, and the evaluation direction is the scan direction. With respect to the scan direction (90°), both patterns 1 and 2 are positive because the change in feature quantity is both positive. With respect to the spatial direction (X-direction), pattern 1 is positive because the position error in the X-direction is positive and the pattern size is also increasing, while pattern 2 is negative because the position error in the X-direction is negative and the pattern size is increasing. Thus, inconsistency is found because the sign differs depending on the pattern. Accordingly, it can be seen that the present sample image has distortion due to the scan direction (90°).

As described above, by evaluating the state of distortion with reference to the phenomenon analysis sheet or the data base, the status of complex distortion can be grasped. In the following, a distortion evaluation method which is particularly effective when a relatively simple distortion is present will be described.

According to the present embodiment, a method will be described such that the distortion contributing factor is identified on the basis of an image signal obtained by scanning a beam in two scan line directions. With reference to FIG. 7, the example was described in which the scan line directions are set in three directions (θ, θ+180°, θ+90°), and the feature quantities $L_{1st}$ to $L_{7th}$ are determined. In the present example, image distortion evaluation is performed on the basis of $L_{1st}$ to $L_{3rd}$. If the beam condition and the sample condition are such that the pattern width increases linearly due to the influence of charging and the like, $L_{1st}$ to $L_{3rd}$ can be expressed as follows:

$$L_{1st}=L+E_k+D_{0°} \tag{11}$$

$$L_{2nd}=L+2E_k+D_{180} \tag{12}$$

$$L_{3rd}=L+3E_k+D_{180} \tag{13}$$

By solving $D_{180°}-D_{0°}$ and $n \cdot E_k$ according to the above expressions, the status of distortion occurring in the plane, the scan direction (position of the measured object in the scan area), or the degree of influence of the beam irradiation time on distortion can be grasped. For example, when $D_{180°}-D_{0°}$ is large, it is seen that the distortion depending on scan direction is large. Further, if $n \cdot E_k$ is greater, it can be seen that the distortion is caused by a temporal contributing factor due to beam irradiation. Thus, when it is only desired to know the relative degrees of influence, the relevant information may be displayed on a display apparatus and the like. An alert may be issued when a predetermined threshold value is exceeded.

REFERENCE SIGNS LIST

101 Cathode
102 First anode
103 Second anode
104 Primary electron beam
105 First focusing lens
106 Second focusing lens
107 Objective lens
108 Aperture plate
109 Scanning coil
110 Sample
111 Orthogonal electromagnetic field (E×B) generator for secondary signal separation
112 Secondary signal
113 Secondary signal detector
114 Signal amplifier
115 Deflecting coil
116 Sample stage
120 High-voltage control power supply
121, 122 Lens control power supply
123 Objective lens control power supply
124 Scan coil control power supply
125 Deflecting coil control power supply
130 Computer
131 Image memory
132 Image display apparatus
133 Recording apparatus
134 Interface
135 Input apparatus

The invention claimed is:

1. An image forming apparatus comprising:
a computing apparatus configured to form an integrated image by integrating image data obtained by a charged particle beam apparatus, wherein:
the computing apparatus is configured to calculate, from a plurality of images with different scan directions of the charged particle beam apparatus:
first information about an amount of change in a feature quantity in accordance with the time of irradiation of the charged particle beam;
second information about the amount of change in the feature quantity before and after a change in beam scan direction; and
third information about a position error of a pattern on the images before and after the change in beam scan direction, and
the second information is calculated according to $$(L_{2nd}+L_{3rd}-L_{1st}-L_{4th}) \div 2$$

where:
$L_{1st}$: a feature quantity obtained in scan direction θ;
$L_{2nd}$: a feature quantity obtained in scan direction θ+α;
$L_{3rd}$: a feature quantity obtained in scan direction θ+α after the feature quantity $L_{2nd}$ is acquired; and
$L_{4th}$: a feature quantity obtained in scan direction θ after the feature quantity $L_{3rd}$ is acquired.

2. The image forming apparatus according to claim 1, wherein the first information is differential information of the feature quantity between different image data acquired at different timing.

3. The image forming apparatus according to claim 1, wherein the second information is differential information between the feature quantity acquired before the change in scan direction and the feature quantity acquired after the change in scan direction.

4. The image forming apparatus according to claim 1, wherein the second information includes $$(L_{5th}+L_{6th}-L_{4th}-L_{7th}) \div 2$$

wherein:
$L_{5th}$: a feature quantity obtained in scan direction θ+β;
$L_{6th}$: a feature quantity obtained in scan direction θ+β after the feature quantity $L_{5th}$ is acquired; and
$L_{7th}$: a feature quantity obtained in scan direction θ after the feature quantity $L_{6th}$ is acquired.

5. An image forming apparatus comprising:
a computing apparatus configured to form an integrated image by integrating image data obtained by a charged particle beam apparatus, wherein:
the computing apparatus is configured to calculate, from a plurality of images with different scan directions of the charged particle beam apparatus:
first information about an amount of change in a feature quantity in accordance with the time of irradiation of the charged particle beam;
second information about the amount of change in the feature quantity before and after a change in beam scan direction;
third information about a position error of a pattern on the images before and after the change in beam scan direction, and
the second information is calculated according to $$(L2nd+L3rd-L1st-L4th) \div 2$$

where:
- L1st: feature quantity obtained in scan direction $\theta$;
- L2nd: feature quantity obtained in scan direction $\theta+\alpha$;
- L3rd: feature quantity obtained in scan direction $\theta+\alpha$ after the feature quantity L2nd is acquired; and
- L4th: feature quantity obtained in scan direction $\theta$ after the feature quantity L3rd is acquired, and
- the computing apparatus multiplies the third information with the second information.

6. The image forming apparatus according to claim 1, wherein the computing apparatus extracts a sign of the first information, the second information, and/or the third information.

7. An image forming apparatus comprising:
- a computing apparatus configured to form an integrated image by integrating image data obtained by a charged particle beam apparatus, wherein:
- the computing apparatus is configured to calculate, from a plurality of images with different scan directions of the charged particle beam apparatus:
  - first information about an amount of change in a feature quantity in accordance with the time of irradiation of the charged particle beam;
  - second information about the amount of change in the feature quantity before and after a change in beam scan direction; and/or
  - third information about a position error of a pattern on the images before and after the change in beam scan direction, and the second information is calculated according to $$(L2nd + L3rd - L1st - L4th) \div 2$$

where:
- L1st: feature quantity obtained in scan direction $\theta$;
- L2nd: feature quantity obtained in scan direction $\theta+\alpha$;
- L3rd: feature quantity obtained in scan direction $\theta+\alpha$ after the feature quantity L2nd is acquired; and
- L4th: feature quantity obtained in scan direction $\theta$ after the feature quantity L3rd is acquired; and
- the computing apparatus comprises a library storing a combination of the first information, the second information, and/or the third information in association with information about distortion of the images, and the computing device compares the library with the first information, the second information, and/or the third information obtained on the basis of the acquisition of the images.

8. The image forming apparatus according to claim 7, wherein the computing apparatus causes a combination of the image data acquisition condition, the first information, the second information, and/or the third information to be displayed on a display apparatus in association with one another.

9. The image forming apparatus according to claim 7, wherein the image data acquisition condition includes at least one of a type of the pattern and the beam scan direction.

10. The image forming apparatus according to claim 5, wherein the computing apparatus extracts a sign of the first information, the second information, and/or the third information.

* * * * *